United States Patent [19]

Shiga et al.

[11] Patent Number: 4,994,435
[45] Date of Patent: Feb. 19, 1991

[54] LAMINATED LAYERS OF A SUBSTRATE, NOBLE METAL, AND INTERLAYER UNDERNEATH AN OXIDE SUPERCONDUCTOR

[75] Inventors: Shoji Shiga; Masanori Ozaki, both of Utsunomiya; Ton-Chi Chang, Yokohama; Nakahiro Harada, Yokohama; Masanao Mimura, Yokohama, all of Japan

[73] Assignee: The Furukawa Electric Co., Ltd., Tokyo, Japan

[21] Appl. No.: 256,763

[22] Filed: Oct. 11, 1988

[30] Foreign Application Priority Data

Oct. 16, 1987 [JP] Japan .................... 62-260864
Oct. 23, 1987 [JP] Japan .................... 62-267853
Oct. 28, 1987 [JP] Japan .................... 62-272736

[51] Int. Cl.$^5$ ............................ H01L 39/14
[52] U.S. Cl. .................... 505/001; 29/599; 204/192.24; 437/62; 428/633; 505/701; 505/704
[58] Field of Search .......... 505/001, 701, 704; 437/62; 204/192.24; 428/633; 29/599

[56] References Cited

U.S. PATENT DOCUMENTS 4,316,785  2/1982  Suzuki et al. .................... 427/63
4,842,366  6/1989  Sawada et al. .................... 29/599

FOREIGN PATENT DOCUMENTS 0292126  11/1988  European Pat. Off.
0298866   1/1989  European Pat. Off. ............ 428/930
0307246   3/1989  European Pat. Off. ............ 438/930

OTHER PUBLICATIONS

Inoue et al. Jap. Jour. Appl. Phys. 26(Sep. 1987) L-1443.
Nakayama et al. Jap. Jour. Appl. Phys. 26 (Dec. 1987) L-2055.
Naito et al. Jour. Mat. Res. 2 (Nov.-Dec., 1987) 713.
Gurvitch et al. Appl. Phys. Lett., 51 (28 Sep. 1987) 1027.
Chien et al. Appl. Phys. Letts. 51 (Dec. 1987) 2155.
Koinuma et al. Jap. Jour. Appl. Phys. 26 (May 1987) L-763.
Hammond et al. ed. Gubser et al. MRS-Meeting, Apr. 1987.
Advanced Ceramic Materials-Ceramic Superconductors, vol. 2, No. 3B, Jul. 1987, pp. 388-400, Westerville, U.S.; R. W. McCallum et al.: "Problems in the Production of YBa2Cu3Ox Superconducting Wire".

*Primary Examiner*—Upendra Roy
*Attorney, Agent, or Firm*—Frishauf, Holtz, Goodman & Woodward

[57] ABSTRACT

This invention discloses an oxide superconductor shaped body including a noble metal layer formed on at least one surface of an oxide superconductor layer formed on a substrate, and a method of manufacturing oxide superconductor shaped body.

22 Claims, 1 Drawing Sheet

4,994,435

LAMINATED LAYERS OF A SUBSTRATE, NOBLE METAL, AND INTERLAYER UNDERNEATH AN OXIDE SUPERCONDUCTOR

Background of the Invention

1. Field of the Invention

The present invention relates to an oxide superconductor shaped body used in electric wires, cables, wiring circuit boards, or electric and electronic components and a method of manufacturing the same.

2. Description of the Related Art

A typical oxide superconductor is a Ba-Pb-Bi oxide which exhibits superconducting properties at a liquid He temperature. In recent years, oxide superconductors (to be referred to simply as superconductors hereinafter) exhibiting superconducting properties at temperatures higher than liquid $H_2$, $N_e$ and $N_2$ temperatures have been developed. These superconductors are composite oxides such as $(La_xSr_{1-x})_2CuO_4$ and $YBa_2Cu_3O_x$, each of which is constituted by a Group IIIb element, an alkaline earth metal, and Cu. Such a superconductor has a $K_2NiF_4$ structure or an $O_2$-deficient laminar perovskite structure. Typical laminar materials having a Cu-O plane structure are a Bi-Sr-Ca-Cu-O material and a Tl-Ba-Ca-Cu-O material, which have higher critical temperatures (Tc). Their examples are $Bi_2Sr_2CaCu_2O_8$, $Bi_2Sr_2Ca_2Cu_3O_{10}$, $Tl_2Ba_2CaCu_2O_8$, $Tl_2Ba_2Ca_2Cu_3O_{10}$, and $TlBa_2Ca_2Cu_3O_{11}$. The superconducting mechanism of the above materials is not fully clarified, but it is assumed that a superconducting current is generated along the Cu-O plane.

Other superconductor oxides include $SrTiO_{3-x}$, $A_xWO_3$, $A_xMoO_3$, $A_xReO_3$, $Ag_7O_8X$, $LiTiO_4$, and the like.

The above oxide superconductors are formed into thick films according to paste printing or the like, or thin films according to physical vapor deposition (t be referred to simply as PVD) and chemical vapor deposition (to be referred to simply as CVD). Alternatively, the oxide superconductors are formed into conductors such as wires and strips and are used in a variety of applications.

All epitaxial methods such as PVD are practiced in a vacuum. In order to prepare an oxide such as $YBa_2Cu_3Ox$, $O_2$ becomes short due to a side reaction such as a decomposition reaction. In this case, a vacuum atmosphere containing a small amount of $O_2$ is utilized. However, it is difficult to maintain an optimal composition. For this reason, the resultant film tends to be amorphous and its superconducting properties are degraded. In the worst case, no superconducting properties can be obtained.

Under these circumstances, in a conventional method, the resultant film is heated in an oxygen-containing atmosphere at about 900° C. to adjust the composition of oxygen and the like and the crystal structure, thereby preparing a superconductor.

The superconductor shaped bodies must withstand various types (i.e., mechanical and thermal) of stress and strain in practice and must have flexibility so as to obtain a desired shape. For example, although a superconductor shaped body is cooled in a refrigerant such as liquid nitrogen during use, it is returned to room temperature during nonuse. Therefore, the superconductor shaped bodies are used under severe heat cycle conditions.

A method of forming a superconductor film on a substrate with excellent flexibility (e.g., a metal substrate) and using the superconductor shaped body in practice is taken into consideration. However, during heating for controlling the superconducting properties, the substrate metal is diffused in the superconductor to degrade the superconducting properties such as a critical current density (Jc), a critical temperature (Tc), and a critical magnetic field (Hc).

In addition, during heating, the constituting components of the superconductor are segregated at an interface between the superconductor and the substrate or at the superconductor surface. In the worst case, volatile components are removed, and desired superconducting properties cannot be obtained.

Furthermore, when the superconductor film is brought into contact with outer air, the superconducting properties are immediately degraded by humidity and contamination gas components in air.

In order to use oxide uuperconductors as superconductor shaped bodies which satisfy specific application purposes, at least one of the following conditions must be satisfied as an object of the present invention. Major applications of the present invention are electric wires, cables, wiring circuit boards, various magnets, magnetic and electromagnetic shield bodies, electronics devices, and device wires.

(1) A superconductor according to the present invention has Tc and Hc inherent to itself and exhibits a Jc as high as possible.

(2) A superconductor satisfies a condition of current capacity Ic according to a specific application.

(3) A superconductor satisfies necessary mechanical conditions such as strength and flexibility in addition to the above-mentioned electric conditions. Flexibility is particularly indispensable in electric wires.

(4) A superconductor has an excellent thermal property, i.e., a heat stress generated by the superconductor is as small as possible so as to allow it to withstand heat cycles at least at a refrigerant temperature and room temperature.

(5) A superconductor has properties and a structure, both of which withstand a high-temperature process during fabrication. This condition is very important in practical applications.

(6) A superconductor is stable for a long period of time. In particular, high electromagnetic stability inherent to the superconducting phenomenon and high chemical stability against external substances can be achieved.

(7) Electric connection properties are also indispensable.

(8) A superconductor is inexpensive, as a matter of course.

SUMMARY OF THE INVENTION

The present invention has been made in consideration of the above situation, and its object is to provide a highly flexible superconductor shaped body capable of withstanding mechanical and thermal stress and strain and being substantially free from quality deterioration for a long time, and a method of manufacturing the same.

According to an aspect of the present invention, there is provided a superconductor shaped body wherein an oxide superconductor layer having a noble metal layer on at least one of the surfaces thereof is formed on a substrate.

According to another aspect of the present invention, there is provided a method of manufacturing a superconductor shaped body, comprising the steps of forming, on a substrate, an oxide superconductor layer having a noble metal layer formed on at least one surface of an oxide superconductor layer, directly or with an interlayer formed between the noble metal layer and the oxide superconductor layer; and heat-treating the resultant structure in an oxygen-containing atmosphere.

DETAILED DESCRIPTION OF THE PREFERRED EMBODIMENTS

Figure 1:
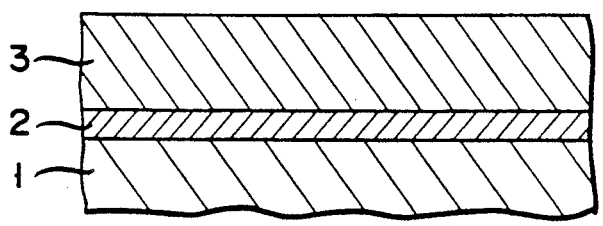
FIGS. 1, 2, 3, 4, and 5 are sectional views for explaining oxide superconductor shaped bodies according to embodiments of the present invention, respectively.
Figure 2:
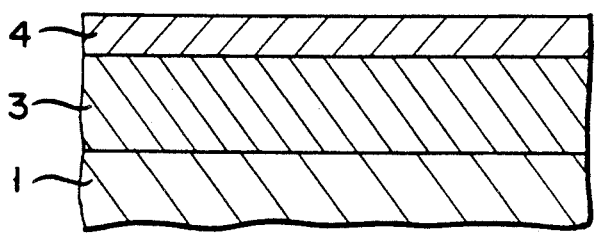
Figure 3:
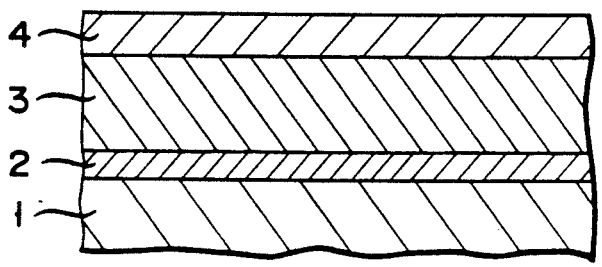

As shown in the sectional view of FIG. 1, an oxide superconductor shaped body according to the present invention is so formed that noble metal layer 2 is formed on substrate 1, and superconductor layer 3 is formed on noble metal layer 2. As shown in FIG. 2, another superconductor shaped body according to the present invention is formed such that noble metal layer 4 is formed on superconductor layer 3. As shown in FIG. 3, still another superconductor shaped body is formed such that noble metal layer 2, oxide superconductor layer 3, and noble metal layer 4 are sequentially formed on substrate 1. These are the typical structures of the superconductor shaped bodies according to the present invention.

Figure 4:
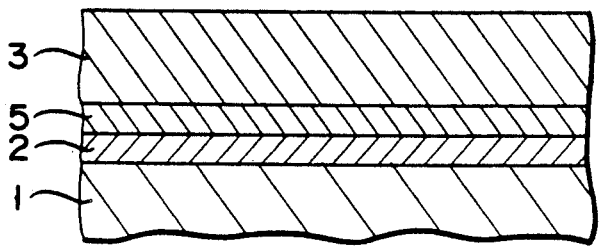
Figure 5:
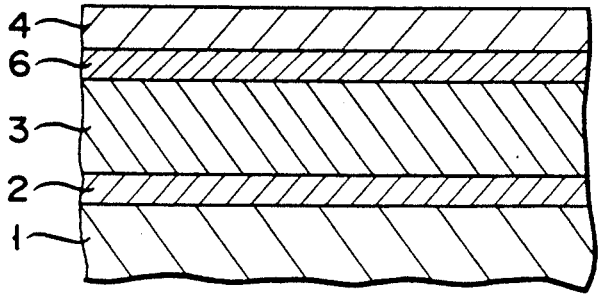

However, the present invention is not limited to the structures described above. Any film may be interposed between the layers described above for specific application purposes. For example, as shown in FIG. 4, metal and/or nonmetallic material layer 5 can be interposed between noble metal layer 2 and superconductor layer 3. As shown in FIG. 5, thin transition metal layer or nonmetallic material layer 6 is interposed between superconductor layer 3 and noble metal layer 4.

The types of substrate vary according to application purposes. In most cases, a property required as the primary condition for the substrate is mechanical strength, and stability such as electromagnetic stability is also important. In order to prepare electric wires and cable conductors, a metal is most suitable because it is excellent in flexibility and mechanical strength and can be easily elongated at low cost. The properties required for the substrate are minimum heat stress in a cooling/heating cycle and a thermal expansion coefficient of 5 to $15 \times 10^6/°C$. Examples of the substrate are Ti, Zr, Ta, Nb, Fe, Ni, Cr, Co, and an alloy of these metals. Typical examples of the alloy are Ni-Cr, stainless steel, an Fe-Ni-Cr alloy (e.g. SUS-310 or SUS-410), an Fe-Cr alloy steel, a Hastelloy, (that is a Ni-Mo alloy) and Cu-Ni alloy (e.g. Monel). The above examples may be combined with Cu or Al having a high electric conductivity and more efficient thermal conduction, thereby preparing composite substrates. In addition to the metallic materials described above, a polycrystal of a ceramic such as $SrTiO_3$, MgO, $ZrO_2$, $Al_2O_3$, BeO, BN, AlN, or carbon and an amorphous inorganic material such as $SiO_2$, polycomponent glass, or the like can be used as substrate materials.

A $ZrO_2$ or $Al_2O_3$ ceramic sintered body is used for, e.g., a wiring circuit board. A single crystal of GaAs, InP, or the like is used for electronics devices. That is, the general shapes of the substrates are a plate-like shape, an elongated tape-like shape, and a wire-like shape. As described above, the polycrystal is an indispensable condition for the substrate with some exceptions to prepare a high-performance film on an industrial basis according to the present invention.

Examples of the noble metal layer formed on or above the substrate or the superconductor layer are Ag, Au, Pd, Pt, In, Os, Ru, Rh, and an alloy of these metals. The noble metal layer can be formed by sputtering, vacuum deposition, ion plating, metalorganic chemical vapor deposiiton (to be referred to simply as MOCVD), plasma spraying, and mechanical bonding.

The noble metal layer formed on the substrate according to the present invention serves as a barrier for preventing constituting elements of the substrate from entering the superconductor during heating. The noble metal layer formed on the superconductor layer prevents segregation and evaporation of the constituting elements of the superconductor during heating. In addition, the latter layer prevents the superconductor from abrupt deterioration when the superconductor is brought into contact with external moisture or toxic gases such as $SO_2$, $NO_x$, $H_2S$, and $Cl_2$ during use, and at the same time contributes to improve thermal and magnetic stability of the superconductor and to effectively facilitate external electric connections.

The thickness of the noble metal layer formed on the substrate preferably falls within the range of 0.01 to 10 μm and most preferably 0.1 to 2 μm so as to maximize the effect as the barrier and the like.

Of the noble metals used in the present invention, Ag is more inexpensive but has better workability than gold- and platinum-based metals. Ag does not form a solid solution with a major substrate material such as Fe, Cr, Ni, Ti, Zr, Co, or Mo, thereby providing a better barrier effect. In addition, it is confirmed that Ag is partially mixed in the superconductor to increase a Jc value.

The function of Ag can also be found in an Ag alloy such as Ag-Pd, Ag-Au, Ag-Pt, Ag-In, Ag-RE (RE: rare earth elements), Ag-Sn, Ag-Zn, Ag-Cu, and Ag-Ni. The effect can be maximized when the Ag content falls within the range of 99 to 55 wt %.

Ag has a high $O_2$ diffusion rate at high temperatures, and permeates $O_2$ in the superconductor. This degrades the superconducting property, and in some cases, the substrate is oxidized and peeled from the superconductor layer. However, the above-mentioned alloys have relatively low $O_2$ diffusion rates, and the above drawback does not occur. These alloys have a better barrier effect for the substrate and the superconductor layer than Ag. In particular, an Ag-Pd alloy is effective.

According to the present invention, the noble metal formed on the superconductor layer is preferably Ag which is not oxidized and has good $O_2$ permeability. Segregation and evaporation of the superconductor components during heating can be prevented. $O_2$ can be sufficiently supplied to an $O_2$-deficient superconductor material.

The above function is effective when the thickness of the noble metal film falls within the range of 0.05 μm to twice the thickness of the superconductor film. If the thickness is less than 0.05 μm, the above function cannot be sufficiently exhibited. However, the thickness is excessively large, incomplete $O_2$ permeation, an increase in thermal stress in the cooling/heating cycle, and an economical disadvantage occur.

When a third material is interposed between the noble metal and the superconductor according to the present invention, many advantages can be provided. As shown in FIG. 4, a material for interlayer 5 between noble metal layer 2 on the substrate side and superconductor layer 3 includes $TiO_2$, $ZrO_2$, $HfO_2$, BeO, MgO, BaO, SrO, CaO, $BaZrO_3$, $SrZrO_3$, $SrTiO_3$, $BaTiO_3$, and $BaF_2$. These materials have free energy ($\Delta G°$) equal to or lower than that of BaO, a crystal structure such as a cubic, hexagonal, tetragonal, or rhombic structure, and is substantially inactive with an oxide superconductor. Therefore, the thickness of the noble metal layer such as an Ag layer can be reduced, and the interlayer serves as a buffer layer for preventing oxidation of the substrate caused by oxygen permeation by the noble metal. It is more important for the interlayer to dominate growth of the superconductor layer and accelerate formation of crystal orientation for maximizing a superconducting current. As described above, most of the oxide superconductors are laminar materials, and a superconducting current flows in a direction parallel to the Cu-O plane perpendicular to the C-axis. Crystal orientation of the substrate in a direction perpendicular to the C-axis is required in most cases. The material for the interlayer having the above functions can be selected in view of both crystal structures and chemical reaction properties. The thickness of the interlayer is 0.01 μm or more, and preferably 0.05 μm to 2 μm in practice.

A transition metal or its alloy can be used in place of the above inorganic material to form interlayer 6 shown in FIG. 5.

A layer of a transition metal or its alloy formed on the superconductor layer increases adhesion strength between the superconductor layer and the noble metal layer since it is sandwiched therebetween. In a heat cycle between the refrigerant temperature of liquid nitrogen and room temperature during use, the layer of the transition metal or its alloy can prevent peeling of the noble metal layer and maximize the function of the noble metal layer.

Transition metals used in the present invention are Group IV, V and VI elements of the Periodic Table, and most useful elements are Ti, Zr, Cr, Mo, W, Nb, Ta, Fe, Ni, Co, an Ni-P alloy, an Ni-W-P alloy, an Ni-Cu alloy, and an Fe-Cr-Ni alloy of austenite stainless steel.

The above function can be obtained with the transition metal due to the following reason according to the present invention. The transition metal has a covalent bond with the superconductor through oxygen atoms of the superconductor and has a metallic bond with a noble metal, so that the transition metal can be strongly bonded to both the superconductor and noble metal layers. In this manner, the layer of the transition metal or its alloy (to be referred to as a transition metal hereinafter) improves adhesion strength between the superconductor layer and the noble metal layer. Therefore, the thickness of the transition metal layer is preferably as small as possible, i.e., falls within the range of 0.001 to 0.5 μm and most preferably 0.001 to 0.1 μm. If the thickness is excessively large, $O_2$ permeation can be retarded. In addition, the transition metal is oxidized to degrade the superconducting properties.

A multi-layered structure according to the present invention is not limited to the above example. For example, a stabilizing metal layer such as a Cu or Al layer may be formed as an uppermost layer. In addition, a heat conduction layer such an AlN, C, or BN layer, or an insulating protective layer consisting of an organic polymer may be formed as the uppermost layer.

Typical examples of the superconductor according to the present invention are $(LaSr)_2CuO_4$, $YBa_2Cu_3O_x$, BiSrCaCuO, and TlBaCaCuO. $YSr_{0.5}Ba_{1.5}Cu_3O_x$, $Y_{0.8}Sc_{0.2}Ba_2Cu_3O_x$, $ErBa_2Cu_3O_x$, $DyBa_2Cu_3O_x$, $MsBa_2Cu_3O_x$ (Ms: misch metal) (wherein $x=7-\delta$, and $\delta = 0$ to 0.5) may be used in place of the above examples. These superconductor materials have perovskite structures. The above oxides include an oxide obtained by partially substituting 0 with an anion such as F, and an oxide obtained by partially substituting Cu with a cation such as Ag, Ni, or Fe.

The thickness of the superconductor film can be arbitrarily determined but preferably falls within the range of 0.1 μm to 1 mm, and most preferably 0.1 to 5 μm.

The multi-layered structure according to the present invention as described above can be formed by PVD, CVD, plasma spraying, screen printing, spin coating, spraying heat decomposition, or a combination of a plurality of methods as needed. In general, PVD, CVD, and spin coating are used to form thin films on the order of submicrons or microns, and other methods are used to form thick films. The PVD methods include sputtering, vacuum deposition, and ion plating, which are used to form a superconductor layer, a noble metal layer, and an interlayer.

In order to form a crystalline superconductor layer, a substrate must be usually heated at a high temperature of about 500° C. or more. PVD is performed in the presence of a low-pressure $O_2$ gas. In general, since a shortage of oxygen produces a deposited product, an oxidation process is inevitable. Oxidation is effectively performed by plasma oxidation or plasma anodic oxidation. However, heating in an $O_2$ or $O_3$ atmosphere is generally performed.

In particular, in a laminar perovskite structure of $YBa_2Cu_3O_7$, a rhombic system of a low-temperature stable type is subjected to transition at 500° to 750° C. while absorbing $O_2$. Therefore, heating under this temperature condition must be performed. In this case, heating is performed in the presence of $O_2$, and a partial pressure $O_2$ falls within the range of 0.01 atm or more and, most preferably, 0.1 atm or more. In general, a heat treatment is performed in air or in a flow of pure $O_2$.

The function of $O_2$ is effectively found in the temperature range of 350° to 980° C. $O_2$ diffusion, generation and growth of crystal nuclei, and crystal orientation and dislocation occur in this temperature range. As a matter of fact, during heating, heating in another atmosphere may be partially used together with the $O_2$ atmosphere as needed.

If the heating temperature is less than 350° C., the above effect cannot be satisfactorily obtained. However, if the temperature exceeds 980° C., the components are evaporated significantly to degrade the superconducting properties.

When a predetermined period of time has elapsed, the heated structure is cooled to at least 200° C. at a rate of 50° C./min or less. When the cooling rate is excessively high, the heating effect cannot be satisfactorily obtained. In the worst case, cracks are formed in the superconductor layer, or the superconductor layer may be peeled from the substrate.

The above heat treatment can be performed more than once during or after the fabrication as needed. In particular, when the upper noble metal layer is formed, it is very effective to perform oxidation.

A noble metal layer is not reacted with an oxide at high temperatures and allows permeation of oxygen.

Constituting elements such as an alkaline earth metal and Cu are not segregated or evaporated during heating to optimize the composition of the superconductor material and its crystal structure. Therefore, a superconductor having excellent properties can be obtained.

Of the noble metals, Ag has a high $O_2$ permeability and a high electric conductivity, and is inexpensive, thus resulting in a most useful material. In most practical applications, a Pt element such as Pd or Pt is preferably formed as an underlying thin film under the Ag film. In this case, the thickness of the Pt element layer falls within the range of 0.01 to 0.5 $\mu$m and, most preferably 0.03 to 0.3 $\mu$m. Then, adhesion strength between the Ag layer and the superconductor layer is not impaired. Durability against thermal stress caused by repeated cooling to a very low temperature of liquid N2 can be increased. In addition, the noble metal film prevents denaturing of the superconductor layer by external moisture and a very small amount of $SO_2$, $NO_x$, $H_2S$, and $Cl_2$.

The noble metal film effectively improves thermal and magnetic stability of the superconductor layer and electrical connections with external devices.

The above effects can be obtained when the thickness of the noble metal film falls within the range of 0.05 $\mu$m and twice the thickness of the superconductor layer. If the thickness is less than 0.05 $\mu$m, the above effects cannot be satisfactorily obtained. However, if the film thickness is excessively large, incomplete $O_2$ permeation, an increase in thermal stress in the cooling/heating cycle, and an economical disadvantage occur.

As described above, the substrate must be kept heated at a high temperature to form an oxide superconductor according to any method including PVD and CVD. However, such a temperature condition, in turn, causes a reverse sputtering phenomenon. A sputtering speed is reduced to one of several fractions, thus degrading productivity. In addition, since the substrate is kept heated at a high temperature for a long period of time, a side reaction occurs between the superconductor and the substrate to degrade the superconducting properties. A heating device is required to heat the substrate to a high temperature. In addition, since the substrate is placed in the $O_2$-containing atmosphere, its surface is excessively oxidized to degrade adhesion strength between the substrate and the superconductor.

In some cases, it is more practical to uniformly sputter and form an amorphous oxide film without heating the substrate and to heat the resultant structure in another $O_2$-containing atmosphere to obtain a superconductor film having excellent crystallinity.

When the amorphous oxide superconductor is formed as described above, the shaped body is heated in the oxygen-containing atmosphere to obtain a superconductor.

In order to manufacture a tape or a linear superconductor shaped body, the heat-resistive substrate is caused to travel, and a superconductor material, a transition metal, and a noble metal are sequentially formed on the traveling substrate in the form of films. The resultant structure is heated through a furnace.

In order to obtain satisfactory electric and mechanical properties of cables and magnetic coil wirings in practical applications, thickness X of the superconductor film falls within the range of 0.1 to 5 $\mu$m, and the following inequality defining the relationship between thickness X and diameter or thickness Y of the substrate must be satisfied:

$$0.5Y \geq X \geq 0.001Y$$

wherein X depends on the Jc value. Since the Jc value can be greatly increased according to the present invention, 0.001Y or more is required.

In the above case, when the thickness of the superconductor film is less than the minimum value of the above range, sufficient superconducting properties cannot be obtained. However, if the thickness exceeds the maximum value of the above range, the mechanical properties such as flexibility are degraded. In addition, the superconducting properties (especially critical current density Jc) tend to be degraded.

If the substrate size in the present invention is large, the space factor of the superconductor is decreased, and the current capacity is decreased accordingly. Otherwise, the mechanical strength is degraded.

A plurality of superconductor shaped bodies manufactured by the method of the present invention are bundled to form a multi-core conductor or a multi-layered conductor. Cu or Al as a stabilizing metal is combined with the resultant multi-core or multi-layered conductor, and a polymer is used as an insulator to cover the conductor. When the superconductor shaped body according to the present invention is used for a circuit, a device, and a plate coil, the superconductor shaped body is etched to obtain a desired pattern.

The present invention will be described in detail by way of its examples.

EXAMPLE 1

An Ag-20 wt % Pd alloy was sputtered in an Ar atmosphere (20 mTorr) to form a 0.1-$\mu$m Ag-Pd film on a 0.1-mm thick Ti tape, and the resultant structure was heated to 670° C. by a high frequency magnetron sputtering apparatus using an oxide of composition $YBa_{2.5}Cu_{4.6}O_x$ as a target and applying a load of 250 W in an Ar+$O_2$ atmosphere (50 mTorr; $O_2$: 25%), thereby forming a 2-$\mu$m thick superconductor film to prepare a superconductor shaped body.

EXAMPLE 2

A superconductor shaped body as in Example 1 was kept heated in an $O_2$ atmosphere of 1 atm at 750° C. for 2 hours and was cooled to 200° C. at a cooling rate of 12° C./min.

EXAMPLE 3

A superconductor shaped body was prepared following the same procedures as in Example 2 except that heating was performed at 880° C. for 15 minutes.

EXAMPLE 4

Ag was sputtered to form a 0.8-$\mu$m thick Ag film on a superconductor shaped body as in Example 1 in an Ar atmosphere (20 mTorr). The resultant structure was kept heated at 880° C. for 15 minutes and then cooled to 200° C. at a cooling rate of 12° C./min.

EXAMPLE 5

A superconductor shaped body was manufactured by the same procedures as in Example 4 except that a Pd was sputtered to form a 0.2-$\mu$m thick Pd film in place of the Ag film.

EXAMPLE 6

A superconductor shaped body was prepared following the same procedures as in Example 1 except that Pd was sputtered to form a 0.2-μm thick Pd film in place of the Ag-20 wt % Pd film. Other procedures in Example 6 were the same as those of Example 4.

EXAMPLE 7

A superconductor shaped body was prepared following the same procedures as in Example 6 except that Ag was sputtered to form a 0.2-μm thick Ag film was formed on asubstrate in place of the Pd film.

EXAMPLE 8

A superconductor shaped body was prepared following the same procedures as in Example 7 except that Ag was sputtered to form a 1.5-μm thick Ag film on a substrate.

EXAMPLE 9

Pt was sputtered to form a 0.1-μm thick Pt film on 0.1-mm thick Fe-12 wt % Cr alloy tape and Ag was sputtered to form a 0.05-μm thick Ag film thereon by a high frequency magnetron sputtering apparatus. The resultant structure was heated to 720° C. in an atmosphere of $P_{O2}=3.0\times10^{-3}$ Torr by a polyelement electron beam deposition apparatus using three vapor sources of Er, Cu-Ba, and Cu while an electron beam and a shutter speed were adjusted such that a molar ratio of the vapor speeds of Er:Ba:Cu was 1:2:3, thereby depositing a 3.1-μm thick ErBa2Cu3 Ox layer. Ag was sputtered to form a 0.5-μm thick Ag film on the ErBa$_2$Cu$_3$O$_x$ layer. The resultant structure was kept heated in an O$_2$ atmosphere of 3 atm at 650° C. for an hour and was then cooled to 200° C. at a cooling rate of 35° C./min, thereby manufacturing a superconductor shaped body.

EXAMPLE 10

A superconductor shaped body was manufactured following the same procedures as in Example 9 except that Pd and an Ag-10% In alloy were sputtered in place of Pt and Ag to form a 0.05-μm thick Pd film and a 0.1-μm thick Ag-10% In alloy film.

EXAMPLE 11

A superconductor shaped body was manufactured following the same procedures as in Example 9 except that only Pt was sputtered to form a 0.03-μm thick Pt film on a substrate in place of Pt and Ag.

COMPARATIVE EXAMPLE 1

A superconductor shaped body was manufactured following the same procedures as in Example 4 except that sputtering of the Ag-20% Pd alloy on a substrate was omitted.

COMPARATIVE EXAMPLE 2

A superconductor shaped body was manufactured following the same procedures as in Example 4 except that the thickness of an Ag-20% Pd alloy film on a substrate was set at 0.005 μm.

COMPARATIVE EXAMPLE 3

A superconductor shaped body was manufactured following the same procedures as in Example 1 except that a 0.1-mm thick Cu tape was used as a substrate and sputtering of an Ag-20% Pd alloy on the substrate was omitted.

COMPARATIVE EXAMPLE 4

A superconductor shaped body was manufactured following the same procedures as in Example 4 except that Cu was used as a substrate.

Three types of sample were prepared by using the superconductor shaped bodies. The first samples were the resultant superconductor shaped bodies. Each second sample was prepared such that a corresponding superconductor shaped body was wound around a cylinder having a diameter which was 2,500 times the thickness of the superconductor shaped body, and a heat cycle between dipping of the sample in liquid N$_2$ and room temperature was repeated 50 times. Each third sample was prepared such that a corresponding superconductor shaped body was left in a chamber having a humidity of 70% and a temperature of 55° C. for 100 hours after the above heat cycle was performed. Jc values of the samples in liquid nitrogen were measured.

The results are summarized in Table 1 which also lists compositions of the superconductor shaped bodies.

As is apparent from Table 1, the samples as the superconductor shaped bodies without modifications and the samples after the heat cycle have large Jc values (Examples 1 to 11).

Of the samples subjected to moisture, samples without noble metal layers on the superconductor layers have small Jc values (Examples 1 to 3) because the superconductor layers are degraded by moisture in outer air.

The sample having no noble metal layer on the substrate (Comparative Example 1) and the sample having a noble metal with a thickness of less than 0.01 μm (Comparative Example 2) have smaller Jc values than that of the sample having a noble metal with a thickness of 0.1 μm (Example 4) because the superconductor layers are degraded upon diffusion of constituting elements of the substrate into the superconductor layers during heating.

TABLE 1

| Classification | Substrate | Noble Metal Layer (Inner Layer) μm | Superconductor Layer | Noble Metal Layer (Outer Layer) μm | Heat Treatment Temperature × Time Colling Rate °C./min | Jc (A/cm$^2$) After Fabrication | Jc (A/cm$^2$) After Heat Cycle | Jc (A/cm$^2$) After Exposure to Moisture |
|---|---|---|---|---|---|---|---|---|
| Present Invention Example | | | | | | | | |
| 1 | Ti | Ag—Pd 0.1 | Y—Ba—Cu—O | Not formed | Not performed | 10,500 | 10,000 | 16,00 |
| 2 | Ti | Ag—Pd 0.1 | Y—Ba—Cu—O | Not formed | 750 × 2 H 12 | 12,900 | 12,500 | 12,00 |
| 3 | Ti | Ag—Pd 0.1 | Y—Ba—Cu—O | Not formed | 880 × 15 min 12 | 11,100 | 11,000 | 1,000 |
| 4 | Ti | Ag—Pd 0.1 | Y—Ba—Cu—O | Ag 0.8 | 880 × 15 min 12 | 13,200 | 13,100 | 12,900 |
| 5 | Ti | Ag—Pd 0.1 | Y—Ba—Cu—O | Pd 0.2 | 880 × 15 min 12 | 12,800 | 12,600 | 12,500 |

TABLE 1-continued

| Classification | Substrate | Noble Metal Layer (Inner Layer) μm | Superconductor Layer | Noble Metal Layer (Outer Layer) μm | Heat Treatment Temperature × Time Colling Rate °C./min | Jc (A/cm$^2$) After Fabrication | Jc (A/cm$^2$) After Heat Cycle | Jc (A/cm$^2$) After Exposure to Moisture |
|---|---|---|---|---|---|---|---|---|
| 6 | | Pd 0.2 | Y—Ba—Cu—O | Ag 0.8 | 880 × 15 min 12 | 13,300 | 13,200 | 13,000 |
| 7 | | Ag 0.2 | Y—Ba—Cu—O | Ag 0.8 | 880 × 15 min 12 | 12,500 | 12,000 | 11,700 |
| 8 | | Ag 1.5 | Y—Ba—Cu—O | Ag 0.8 | 880 × 15 min 12 | 13,100 | 13,000 | 12,800 |
| 9 | Fe—Cr | Pt 0.1/Ag 0.05 | Er—Ba—Cu—O | Ag 0.5 | 650 × 1 H 35 | 14,500 | 14,100 | 14,000 |
| 10 | Fe—Cr | Pd 0.05/Ag—In 0.1 | Er—Ba—Cu—O | Ag 0.5 | 650 × 1 H 35 | 13,800 | 13,500 | 13,400 |
| 11 | Fe—Cr | Pt 0.03 | Er—Ba—Cu—O | Ag 0.5 | 650 × 1 H 35 | 13,900 | 13,200 | 13,100 |
| Comparative Product Comparative Example | | | | | | | | |
| 1 | Ti | No | Y—Ba—Cu—O | Ag 0.8 | 880 × 15 min 12 | 7,400 | 5,200 | 5,100 |
| 2 | Ti | Ag—Pd 0.005 | Y—Ba—Cu—O | Ag 0.8 | 880 × 15 min 12 | 8,900 | 8,100 | 8,100 |
| 3 | Cu | No | Y—Ba—Cu—O | Not formed | Not performed | 2,900 | 200 | 0 |
| 4 | Cu | Ag—Pd 0.1 | Y—Ba—Cu—O | Ag 0.8 | 880 × 15 min 12 | 10,500 | 5,800 | 1,900 |

Of the comparative products, the sample having no noble metal layer on the Cu substrate (Comparative Example 3) has a small Jc value before the heat cycle because a reaction between the superconductor layer and the substrate occurs during heating. The Jc value is further decreased after the heat cycle because thermal stress is high due to using Cu substrate having a high thermal expansion coefficient of $18 \times 10^{-6}$/°C.

The sample having the noble metal layer on the Cu substrate (Comparative Example 4) has a larger Jc value than that of Comparative Example 3. However, as compared with Example 4 using Ti having a low thermal expansion coefficient of $8.9 \times 10^{\times 6}$/°C. as a substrate material, the Jc value of the sample of Comparative Example 4 is very small after the heat cycle and after exposure to moisture.

The thermal expansion coefficient of the Fe-12% Cr alloy used in Examples 9 to 11 is $13.1 \times 10^{-6}$/°C.

EXAMPLE 12

Superconductor shaped bodies were manufactured following the same procedures as in Example 4 except that the thickness of an Ag-20% Pd alloy film on a substrate was changed.

The resultant superconductor shaped bodies were used to prepare samples as in Example 1. The Jc values of the samples were measured in liquid nitrogen.

The results are summarized in Table 2 which lists the sputtering thicknesses of an Ag-Pd alloy.

As is apparent from Table 2, the samples in which thickness of the noble metal layer formed on the substrate falls within the range of 0.01 to 10 μm (Nos. 1 to 4 of Example 12), and especially 0.01 to 2 μm (Nos. 3 and 4) have larger Jc values even after the heat cycle and exposure to moisture. However, if the thickness of noble metal layer is less than 0.01 μm (comparative products Nos. 5 and 6), the samples have small Jc values.

EXAMPLE 13

Pt was deposited on a 250-μm diameter $Al_2O_3$ fiber to form a 0.2-μm thick Pt film thereon according to an electron beam deposition, and a 2.7-μm thick superconductor film having a composition of $ErBa_2Cu_3O_x$ was formed thereon in an atmosphere of $P_{O2} = 1.5 \times 10^{-3}$ Torr by using three types of vapor source (i.e., Cu, Er, and a Cu-Ba alloy) under shutter speed control such that Cu:Ba:Er was set to be 3:2:1 for 30 minutes at a rate of 5.5 μm/H. Pt and Ag were sequentially deposited on this amorphous superconductor film to form 0.05- and 0.11-μm thick Pt and Ag films, respectively. The resultant structure was kept heated in air at 870° C. for 60 minutes and was then cooled to 200° C. at a cooling rate of 2° C./min, thereby manufacturing a superconductor shaped body.

EXAMPLE 14

A superconductor shaped body was manufactured following the same procedures as in Example 13 except that an amorphous superconductor film having a composition of $ErBa_2Cu_3O_x$ was vapor-deposited at a rate

TABLE 2

| Classification | | No. | Nobel Metal Layer (Inner Layer) Ag—Pd μm | Jc (A/cm$^2$) After Fabrication | Jc (A/cm$^2$) After Heat Cycle | Jc (A/cm$^2$) After Exposure to Moisture |
|---|---|---|---|---|---|---|
| Present Invention (Example 12) | Samples having preferable noble metal layer thickness | 1 | 0.02 | 11,600 | 11,500 | 11,500 |
| | | 2 | 0.05 | 12,800 | 11,800 | 11,700 |
| | | 3 | 0.1 | 13,200 | 13,100 | 12,900 |
| | | 4 | 0.35 | 13,200 | 13,000 | 13,000 |
| Comparative Product | Samples having small noble metal layer thickness | 5* | 0 | 7,400 | 5,200 | 5,100 |
| | | 6$^x$ | 0.005 | 8,900 | 8,100 | 8,100 |

*The same as Comparative Example 1 in Table 1
$^x$The same as Comparative Example 2 in Table 1 of 2.5 μm/H while an Al$_2$O$_3$ fiber was infrared-heated to about 690° C.

COMPARATIVE EXAMPLES 5 and 6

Superconductor shaped bodies were manufactured following the same procedures as in Examples 13 and 14, respectively, except that noble metal films were not formed on superconductor films.

Samples obtained by the superconductor shaped bodies of Examples 13 and 14 and Comparative Examples 5 and 6 without modifications, and samples obtained by exposing the superconductor shaped bodies in an atmosphere having a relative humidity of 75% and a temperature of 60° C. for 100 hours were prepared. The Jc values of these samples were measured in liquid nitrogen.

Results are summarized in Table 3 which also lists some manufacturing conditions.

As is apparent from Table 4, the samples of the present invention (Nos. 1 to 4 of Example 15) have larger Jc values. However, the samples having the noble metal film thicknesses of less than 0.05 μm (comparative products Nos. 5 and 6) and the samples having a noble metal thickness (comparative product No. 7) which exceed the double thickness of the superconductor film (2.7 μm) do not exhibit good superconducting properties by heating and have small Jc values.

EXAMPLE 16

Superconductor shaped bodies were manufactured following the same film formation and heating procedures as in Examples 1 to 4 except that noble metal films, inorganic material films, and superconductor films were formed on a Hastelloy substrate and a SUS 304 substrate, respectively. X-ray diffraction was performed to evaluate crystallinity of the resultant super-

TABLE 3

| Classification | Substrate | Substrate Pre-Treatment | Substrate Heating (°C.) | Novel Metal Film (μm) | Superconductor Film | Heat Treatment °C. × min | Jc (A/cm$^2$) Before Heating | Jc (A/cm$^2$) After Heating |
|---|---|---|---|---|---|---|---|---|
| Present Invention | | | | | | | | |
| Example 13 | Al$_2$O$_3$ (25 μm φ) | Pt vapor deposition | Not performed | Pt (0.05)/ Ag (0.11) | ErBa$_2$Cu$_3$Ox (2.7 μm) | 870 60 | 16,000 | 15,500 |
| Example 14 | Al$_2$O$_3$ (25 μm φ) | Pt vapor deposition | 690 | Pt (0.05)/ Ag (0.11) | ErBa$_2$Cu$_3$Ox (2.7 μm) | 870 60 | 19,100 | 18,800 |
| Comparative Product | | | | | | | | |
| Comparative Example 5 | Al$_2$O$_3$ (25 μm φ) | Pt vapor deposition | Not performed | Not formed | ErBa$_2$Cu$_3$Ox (2.7 μm) | 870 60 | 12,600 | 80 |
| Comparative Example 6 | Al$_2$O$_3$ (25 μm φ) | Pt vapor deposition | 690 | Not formed | ErBa$_2$Cu$_3$Ox (2.7 μm) | 870 60 | 18,800 | 30 |

As is apparent from Table 3, the samples of the present invention (Examples 13 and 14) have large Jc values. Their values are not almost decreased even after heating. To the contrary, the samples having no noble metal films on the superconductor films (Comparative Examples 5 and 6) are subjected to segregation or evaporation of the constituting elements of the superconductor films by heating and have smaller Jc values than those of the samples of the present invention. In particular, after exposure to moisture, considerable quality deterioration occurs, and the Jc values

EXAMPLE 15

Superconductor shaped bodies were manufactured following the same procedures as in Example 13 except that the thicknesses of Pt and Ag noble metal films were changed. The Jc values of the resultant superconductor shaped bodies were measured in liquid nitrogen. Results are summarized in Table 4 which also lists the thicknesses of noble metal films.

TABLE 4

| Classification | No. | Noble Metal Pt | Ag | Film (μm) Total | Jc 77 K. A/cm$^2$ |
|---|---|---|---|---|---|
| Present Invention (Example 15) | 1 | 0.02 | 0.06 | 0.08 | 9,200 |
| | 2 | 0.02 | 0.19 | 0.21 | 10,500 |
| | 3 | 0.05 | 1.1 | 1.15 | 12,800 |
| | 4 | 0.1 | 3.2 | 3.3 | 10,900 |
| Comparative Product | 5 | 0.02 | — | 0.02 | 150 |
| | 6 | 0.02 | 0.02 | 0.04 | 620 |
| | 7 | 0.5 | 5.9 | 6.4 | 300 | conductor shaped bodies. The Tc and Jc values were measured as superconducting properties. Details are summarized in Table 5.

The sample (No. 7 of Example 16) was obtained by sputtering using Bi$_2$Sr$_2$Ca$_2$Cu$_3$O$_x$ as a target. Layers of Ag, MgO, ZrO$_2$, and BaZrO$_3$ were formed by using targets having these compositions. Heating was performed at temperatures shown in Table 5 after sputtering was completed. The resultant structures were cooled at a rate of about 2° C./min.

The Jc values were measured at 68 K, and the Jc and Tc values were measured with and without an external magnetic field. In this case, the magnetic field of 1,000 gauss was applied to the substrates in a direction perpendicular to its surfaces.

Results are summarized in Table 5 which also lists the respective constituting layers and heating conditions. As is apparent from Table 5, the noble metals have a buffer effect which prevents diffusion of substrate metals. The inorganic material layers have a buffer effect which prevents substrate oxidation caused by oxygen permeation through the noble metal films. Low reactivity with the superconductor layer, and C-axis orientation are obtained. By these effects, the samples of the present invention have large Tc values and high Jc values even in a magnetic field. The samples (comparative products Nos. 3 and 4) have small Jc values adversely affected by the external magnetic field and have poorer properties than those of the samples (Nos. 1 to 8) of Example 16 due to differences in crystal orientation, as can be seen from the results of X-ray diffraction.

TABLE 5

| Classification | No. | Substrate | Nobel Metal Layer | Inorganic Material Layer | Superconductor Layer | Stabilizing Metal Layer |
|---|---|---|---|---|---|---|
| Present Invention (Example 16) | 1 | Hastelloy 0.1 mm | Ag 0.9 μm | MgO 0.2 μm | Y—Ba—Cu—O 0.3 μm | Not formed |
| | 2 | Hastelloy 0.1 mm | Ag 0.9 μm | MgO 0.2 μm | Y—Ba—Cu—O 0.3 μm | Not formed |
| | 3 | Hastelloy 0.1 mm | Ag 1.2 μm | MgO 0.15 μm | Y—Ba—Cu—O 0.3 μm | Ag 1 μm |
| | 4 | Hastelloy 0.1 mm | Ag-40Pd 0.5 μm | $ZrO_2$ 0.3 μm | Y—Ba—Cu—O 0.3 μm | Not formed |
| | 5 | Hastelloy 0.1 mm | Ag-40Pd 0.5 μm | $ZrO_2$ 0.3 μm | Y—Ba—Cu—O 0.3 μm | Not formed |
| | 6 | Hastelloy 0.1 mm | Ag-25Au 0.8 μm | $BaZrO_3$ 0.1 μm | Y—Ba—Cu—O 0.3 μm | Not formed |
| | 7 | Hastelloy 0.1 mm | Ag 0.4 μm | MgO 0.3 μm | $Bi_2Sr_2Ca_2Cu_3O_x$ 2.0 μm | Not formed |
| | 8 | SUS304 0.1 mm | Ag 1.5 μm | MgO 0.2 μm | Y—Ba—Cu—O 0.3 μm | Not formed |
| Comparative Product | 1 | Hastelloy 0.1 mm | Not formed | MgO 0.5 μm | Y—Ba—Cu—O 0.3 μm | Not formed |
| | 2 | Hastelloy 0.1 mm | Not formed | MgO 0.5 μm | Y—Ba—Cu—O 0.3 μm | Not formed |
| | 3 | Hastelloy 0.1 mm | Ag 1.0 μm | Not formed | Y—Ba—Cu—O 0.3 μm | Not formed |
| | 4 | Hastelloy 0.1 mm | Ag 1.0 μm | Not formed | Y—Ba—Cu—O 0.3 μm | Not formed |

| Classification | No. | Heat Treatment | Superconductor crystallinity | Tc (K) | $Jc(A/cm^2)$ at 68K 0 gauss | $Jc(A/cm^2)$ at 68K 1000 gauss |
|---|---|---|---|---|---|---|
| Present Invention (Example 16) | 1 | Not performed | C-axis orientation | 79 | 165,000 | 130,000 |
| | 2 | 750° C. × 2 hrs $P_{O_2}$ = 0.5 atm | C-axis orientation | 85 | 223,000 | 201,000 |
| | 3 | 750° C. × 2 hrs $P_{O_2}$ = 0.5 atm | C-axis orientation | 85 | 223,000 | 190,000 |
| | 4 | Not performed | C-axis orientation | 80 | 209,000 | 175,000 |
| | 5 | 800° C. × 1 hr Atmospheric pressure | C-axis orientation | 87 | 282,000 | 250,000 |
| | 6 | 800° C. × 1 hr Atmospheric pressure | C-axis orientation | 88 | 291,000 | 260,000 |
| | 7 | 890° C. × 4 hrs $P_{O_2}$ = 0.2 atm | C-axis orientation | 100 | 302,000 | 265,000 |
| | 8 | 750° C. × 2 hrs $P_{O_2}$ = 0.5 atm | C-axis orientation | 85 | 218,000 | 185,000 |
| Comparative Product | 1 | Not performed | Random orientation | 70 | 900 | 150 |
| | 2 | 750° C. × 2 hrs $P_{O_2}$ = 0.5 atm | Random orientation | 32 | — | — |
| | 3 | Not performed | Random orientation | 79 | 20,500 | 1,500 |
| | 4 | 750° C. × 2 hrs $P_{O_2}$ = 0.5 atm | Random orientation | 84 | 22,900 | 1,600 |

· by X-ray diffraction

EXAMPLE 17

Superconductor shaped bodies were manufactured following the same procedures as in Example 16 except that the thickness of a BeO film formed in place of Ag and MgO films was changed in No. 7 of Example 16. The Jc values of the resultant superconductor shaped bodies were measured, and results are summarized in Table 6.

As is apparent from Table 6, the thicknesses of the BeO films were checked in Nos. 1 to 6 of Example 17. Samples having small thicknesses (Nos. 1 and 2 of Example 17) have small Jc values which are greatly reduced by a magnetic field. The Jc values of the samples having thicknesses of 1.5 μm and 2.9 μm (Nos. 5 and 6) tend to be reduced. This result coincides with the results of X-ray diffraction. When the thickness of the sample is excessively large, the BeO surface is rough due to its grain size. When the thickness of the sample is small, crystal orientation cannot be effected.

The sample containing no Ag (comparative product No. 7) loses superconducting properties at an experiment temperature of 68 K. This is assumed to be attributable to diffusion of the Hastelloy component. The sample having a very small Ag film thickness (No. 8) has a Jc value half as much as that of the sample (No. 4).

TABLE 6

| No. | Thickness of Ag (μ) | Thickness of BeO (μ) | Crystallinity (Orientation) | $Jc(A/cm^2)$ at 68K 0 gauss | $Jc(A/cm^2)$ at 68K 1000 gauss |
|---|---|---|---|---|---|
| 1 | 0.9 | 0 | Random | 19,000 | 1,100 |
| 2 | 0.9 | 0.006 | Random | 38,000 | 5,000 |
| 3 | 0.9 | 0.03 | C-axis | 195,000 | 151,000 |
| 4 | 0.9 | 0.3 | C-axis | 311,000 | 295,000 |
| 5 | 0.9 | 1.5 | C-axis | 296,000 | 250,000 |
| 6 | 0.9 | 2.9 | C-axis | 190,000 | 139,000 |
| 7 | 0 | 0.3 | Slightly random | 0 | 0 |

(Compara-

TABLE 6-continued

| No. | Thickness of Ag ($\mu$) | Thickness of BeO ($\mu$) | Crystallinity (Orientation) | Jc(A/cm$^2$) at 68K | |
|---|---|---|---|---|---|
| | | | | 0 gauss | 1000 gauss |
| tive Product) | | | | | |
| 8 | 0.1 | 0.3 | C-axis | 153,000 | 109,000 |

EXAMPLE 18

A SUS-310 tape substrate (thickness: 0.05 mm; width: 10 mm) was prepared by using a high frequency magnetron sputtering apparatus.

The substrate was activated in an Ar atmosphere ($10^{-2}$ Torr) according to reverse sputtering. A 1.4-$\mu$m thick amorphous oxide film was formed on the substrate by sputtering in an Ar+O$_2$ atmosphere (25 mTorr; O$_2$: 20%) such that a YBa$_2$Cu$_{3.5}$O$_x$ pellet was used as a target, the substrate was not heated, and a film formation rate was 2.2 $\mu$m/H. Cr was sputtered in an Ar 10 mTorr atmosphere to form a 0.08-$\mu$m thick Cr film on the oxide film, and Ag was then sputtered to form a 0.6-$\mu$m thick Ag film on the Cr film.

The resultant shaped body was heated in an O$_2$ gas flow of 1 atm at 900° C. for 5 minutes, kept at 730° C. for an hour, and then cooled at a cooling rate of 12° C./min, thereby manufacturing a superconductor shaped body.

EXAMPLE 19

A superconductor shaped body was manufactured following the same procedures as in Example 18 except that a crystalline oxide film was formed on a substrate by sputtering using a YBa$_{2.5}$Cu$_{4.5}$O$_x$ target while the substrate was infrared-heated to 650° C., heating of the substrate was stopped, Ti was sputtered to form a 0.003-$\mu$m thick Ti film on the oxide film in the Ar 20 mTorr atmosphere, and Pd was sputtered to form a 0.08-$\mu$m thick Pd film on the Ti film in the same atmosphere.

Since sputtering was performed while the substrate was heated, the crystalline oxide film was obtained. However, the sputtering rate was decreased to 0.5 $\mu$m/H.

EXAMPLE 20

The superconductor shaped body prepared in Example 19 was heated in an O$_2$ atmosphere of 2 atm at 550° C. for three hours and was cooled at a cooling rate of 2° C./min to obtain a superconductor shaped body.

EXAMPLE 21

Pt was deposited on a 25-$\mu$m diameter Al$_2$O$_3$ fiber to form a 0.2-$\mu$m thick Pt film thereon according to an electron beam deposition, and a 2.7-$\mu$m thick superconductor film having a composition of ErBa$_2$Cu$_3$O$_x$ was formed thereon in an atmosphere of O$_2$=3.5×10$^{-3}$ Torr by using three types of vapor source (i.e., Cu, Er, and a Cu-Ba alloy) under shutter speed control such that Cu:Ba:Er was set to be 3:2:1 for 30 minutes at a rate of 5.5 $\mu$m/H. Nb and Ag were sequentially deposited on this amorphous superconductor film to form 0.4- and 2.6-$\mu$m thick Nb and Ag films, respectively. The resultant structure was kept heated in air at 870° C. for six hours and was then cooled at a cooling rate of 2° C./min, thereby manufacturing a superconductor shaped body.

EXAMPLE 22

A superconductor shaped body was manufactured following the same procedures as in Example 21 except that after an Al$_2$O$_3$ fiber was heated to 750° C. and a 1.9-$\mu$m thick crystalline oxide film was deposited thereon at a rate of 1.2 $\mu$m/H, heating of the fiber was interrupted, a 0.01-$\mu$m thick Ni-40% Cu alloy film was deposited thereon in an atmosphere of Ar=1×10$^{-6}$ Torr, and a 2.2-$\mu$m thick Ag film was deposited thereon in the same atmosphere.

EXAMPLE 23

The superconductor shaped body prepared in Example 22 was heated in an O$_2$ atmosphere of 3 atm at 490° C. for four hours and then cooled at a cooling rate of 6° C./min.

COMPARATIVE EXAMPLE 7

A superconductor shaped body was manufactured following the same procedures as in Example 18 except that Ag was not sputtered.

COMPARATIVE EXAMPLE 8

A superconductor shaped body was manufactured following the same procedures as in Example 20 except that Pd was not sputtered.

COMPARATIVE EXAMPLE 9

A superconductor shaped body was manufactured following the same procedures as in Example 20 except that the thickness of sputtered Pd was set to be 0.03 $\mu$m.

COMPARATIVE EXAMPLE 10

A superconductor shaped body was manufactured following the same procedures as in Example 21 except that Pd was deposited to a thickness of 0.7 $\mu$m in place of Ag.

COMPARATIVE EXAMPLE 11

A superconductor shaped body was manufactured following the same procedures as in Example 21 except that Nb was not deposited.

COMPARATIVE EXAMPLE 12

A superconductor shaped body was manufactured following the same procedures as in Example 23 except that the thickness of a deposited Ni-40% Cu alloy was set to be 0.8 $\mu$m.

Each superconductor shaped body thus obtained was wound around a pipe having a diameter 3,000 times the thickness of the superconductor shaped body, and the resultant structure was dipped in liquid nitrogen 150 times, thus performing a heat cycle test. The Jc values of the resultant samples were measured in liquid nitrogen (77 K). These samples were then held in a chamber having a relative humidity of 85% and a temperature of 60° C. for 100 hours, thereby performing a humidity test. In this state, Jc values were measured following the same procedures as described above.

Results are summarized in Table 7 which also lists the compositions of the superconductor shaped bodies.

As is apparent from Table 7, the samples of the present invention (Examples 18 to 23) have large Jc values after each test. The samples having no noble metal films (Comparative Examples 7 and 8) and the sample having a thin noble metal layer (Comparative Example 9) have small Jc values because the superconductor layers are denatured in the humidity test. In particular, since the sample of Comparative Example 7 is heated for crystallization at a high temperature, the constituting elements of the superconductor are segregated or evaporated. Therefore, this sample has a small Jc value after the heat cycle.

The sample having a thick noble metal layer (Comparative Example 10) cannot provide sufficient $O_2$ permeation, and the sample having no transition metal layer (Comparative Example 11) has incomplete adhesion between the substrate and the superconductor layer. Therefore, these samples have small Jc values.

The sample having a thick transition metal layer (Comparative Example 12) has incomplete $O_2$ permeation into the superconductor layer. Part of $O_2$ of the superconductor layer is combined with the transition metal. Therefore, this sample has a small Jc value.

TABLE 7

| Classification | Substrate (Heating) | Superconductor Layer | Transition Metal Layer μm | Nobel Metal Layer μm | Heat Treatment Temperature (°C.) × Time | Jc (A/cm$^2$) After Heat Cycle | Jc (A/cm$^2$) After Exposure to Moisture |
|---|---|---|---|---|---|---|---|
| Present Invention | | | | | | | |
| Example 18 | SUS (Not performed) | Y—Ba—Cu—O | Cr 0.08 | Ag 0.6 | 900 × 5 min → 730 × 1 H | 8,100 | 8,000 |
| Example 19 | SUS (650° C.) | Y—Ba—Cu—O | Ti 0.003 | Pd 0.08 | Not performed | 7,300 | 7,300 |
| Example 20 | SUS (650° C.) | Y—Ba—Cu—O | Ti 0.003 | Pd 0.08 | 550 × 3 H | 9,600 | 9,200 |
| Example 21 | Al$_2$O$_3$ (Not performed) | Er—Ba—Cu—O | Nb 0.4 | Ag 2.6 | 870 × 6 H | 10,400 | 9,900 |
| Example 22 | Al$_2$O$_3$ (750° C.) | Er—Ba—Cu—O | Cu—Ni 0.01 | Pd 0.05/Ag 2.2 | Not performed | 6,300 | 6,300 |
| Example 23 | Al$_2$O$_3$ (750° C.) | Er—Ba—Cu—O | Cu—Ni 0.01 | Pd 0.05/Ag 2.2 | 490 × 4 H | 10,100 | 10,000 |
| Comparative Product | | | | | | | |
| Comparative Example 7 | SUS (Not performed) | Y—Ba—Cu—O | Cr 0.08 | Not formed | 900 × 5 min → 730 × 1 H | 3,900 | 400 |
| Comparative Example 8 | SUS (650° C.) | Y—Ba—Cu—O | Ti 0.003 | Not formed | 550 × 3 H | 9,500 | 50 |
| Comparative Example 9 | SUS (650° C.) | Y—Ba—Cu—O | Ti 0.003 | Pd 0.03 | 550 × 3 H | 9,000 | 300 |
| Comparative Example 10 | Al$_2$O$_3$ (Not performed) | Er—Ba—Cu—O | Nb 0.4 | Pd 3.7 | 870 × 6 H | 50 | 50 |
| Comparative Example 11 | Al$_2$O$_3$ (Not performed) | Er—Ba—Cu—O | Not formed | Ag 2.6 | 870 × 6 H | 3,700 | 600 |
| Comparative Example 12 | Al$_2$O$_3$ (750° C.) | Er—Ba—Cu—O | Cu-Ni 0.8 | Pd 0.05/Ag 2.2 | 490 × 4 H | 3,700 | 3,700 |

As described above, the present invention provides practical conductors and equipment parts of an oxide superconductor by a multi-layered structure including a noble metal layer. The necessary conditions for industrial applications can be apparently satisfied by the present invention, as is apparent from the contents of detailed description of the invention and the examples.

These remarkable effects are obtained with combinations of oxide superconductors and noble metals essentially since an oxide superconductor is an active multivalent mixture and causes active oxidation and reduction during the fabrication. It is also apparent that a method of improving a structure by using an interlayer is indispensable to maximize the function and effect of the present invention.

What is claimed is:

1. An oxide superconductor shaped body comprising:

a substrate consisting of a polycrystalline metal or ceramic having a thermal expansion coefficient of $5 \times 10^{-6}/°$ C. to $15 \times 10^{-6}/°$ C.;

a noble metal layer directly on and in surface contact with said substrate, an interlayer of an inorganic material directly on and in surface contact with said noble metal layer consisting essentially of a material having a free energy ($\Delta G°$) equal to or lower than that of BaO and selected from the group consisting of cubic, hexagonal, tetragonal, and rhombic materials; and an oxide superconductive layer directly on and in surface contact with said interlayer.

2. The body according to claim 1, wherein the inorganic material is a material selected from the group consisting of MgO, BeO, BaO, SrO, TiO$_2$, ZrO$_2$, HfO$_2$, BaTiO$_3$, SrTiO$_3$, BaZrO$_3$, SrZrO$_3$, BaHfO$_3$, and SrHfO$_3$.

3. The body according to claim 1, wherein the oxide consists of an oxide represented by formula AB$_2$Cu$_3$Ox (wherein A represents Y, S, Sc, or a rare earth element, B represents an alkaline earth metal, Cu represents copper, O represents oxygen, and X = 7 − δ where $1 \geq \delta > 0$).

4. The body according to claim 1, wherein the oxide superconductor consists of a Cu-containing oxide.

5. The body according to claim 1, wherein the oxide superconductor layer has a thickness of 0.1 to 5 μm, which is 0.005 to 0.5 times the thickness or diameter of the substrate.

6. The body according to claim 1, wherein the interlayer has a thickness falling within a range of 0.001 to 0.5 μm, and the noble metal layer has a thickness falling within a range of 0.05 to 3 μm.

7. The body according to claim 1, wherein the noble metal is silver or a silver alloy containing 99 to 55 wt. % of silver.

8. The body according to claim 1, wherein the oxide superconductor shaped body has a wire-, strip-, or plate-like shape.

9. The body according to claim 1, wherein the substrate is selected from the group consisting of Ti, Zr, Ta, Nb, Fe, Ni, Cr, Co, Mo, and alloys thereof.

10. The body according to claim 1, wherein the substrate is selected from the group consisting of Ni-Cr alloys stainless steel, Fe-Ni-Cr alloys, Fe-Cr, Cu-Ni alloys, and Ni-Mo alloys.

11. The body according to claim 1, wherein the substrate is selected from the group consisting of $SrTiO_3$, MgO, $ZrO_2$, $Al_2O_3$, BeO, BN, AlN, carbon, $SiO_2$ and polycomponent glass.

12. The body according to claim 1, wherein the noble metal layer is selected from the group consisting of Ag, Au, Pd, Pt, In, Os, Ru, Rh, and alloys thereof.

13. The body according to claim 1, wherein the oxide superconductor consists of an oxide represented by the formula $AB_2Cu_3O_x$ wherein A represents Y, S, Sc, or a rare earth element, B represents an alkaline earth metal, and $X = 7 - \delta$ where $0 \leq \delta < 0.5$.

14. The body according to claim 1, wherein the substrate is selected from the group consisting of (1) Ti, Zr, Ta, Nb, Fe, Ni, Cr, Co, Mo, and alloys thereof; (2) Ni-Cr, stainless steel, Fe-Ni-Cr, Fe-Cr, Cu-Ni, and Ni-Mo alloys; and (3) $SrTiO_3$, MgO, $ZrO_2$, $Al_2O_3$, BeO, BN, AlN, carbon, $SiO_2$ and polycomponent glass;
wherein the noble metal layer is selected from the group consisting of Ag, Au, Pd, Pt, In, Os, Ru, Rh, and alloys thereof; and
wherein the oxide superconductor consists of an oxide represented by the formula $AB_2Cu_3O_x$, wherein A represents Y, S, Sc, or a rare earth element, B represents an alkaline earth metal, and $X = 7 - \delta$ where $0 \leq \delta < 0.5$.

15. The body according to claim 13, wherein
the substrate is A Ni-Mo alloy
the noble metal layer is Ag of thickness 0.05 to 3 μm;
the inorganic material of the interlayer is MgO of thickness 0.001 to 0.5 μm; and
the oxide superconductor is Y-Ba-Cu-O.

16. The body according to claim 13, wherein
the substrate is A Ni-Mo alloy;
the noble metal layer is Ag-40Pd of thickness 0.05 to 3 μm;
the inorganic material of the interlayer is $ZrO_2$ of thickness 0.001 to 0.5 μm; and
the oxide superconductor is Y-Ba-Cu-O.

17. The body according to claim 13, wherein
the substrate is A Ni-Mo alloy
the noble metal layer is Ag-25Au of thickness 0.05 to 3 μm;
the inorganic material of the interlayer is $BaZrO_3$ of thickness 0.001 to 0.5 μm and
the oxide superconductor is Y-Ba-Cu-O.

18. The body according to claim 13 wherein
the substrate is an Fe-Ni-Cr alloy;
the noble metal layer is Ag of thickness 0.05 to 3 μm;
the inorganic material of the interlayer is MgO of thickness 0.001 to 0.5 μm; and
the oxide superconductor is Y-Ba-Cu-O.

19. The body according to claim 17 wherein said interlayer consists essentially of a transition metal selected from the group consisting of Ti, Zr, Cr, Mo, W, Nb, Ta, Fe, Ni, and Co.

20. The body according to claim 17, wherein said interlayer consists essentially of an alloy of a transition metal selected from the group consisting of Ni-P, Ni-P-W, Ni-Cu, and Fe-Cr-Ni austenite stainless steel.

21. An oxide superconductor shaped body comprising:
a substrate consisting of a polycrystalline metal or ceramic having a thermal expansion coefficient of $5 \times 10^{-6}/°C.$ to $15 \times 10^{-6}/°C.$;
a nobel metal layer directly on and in surface contact with said substrate,
an interlayer directly on and in surface contact with said nobel metal layer, said interlayer consisting essentially of a metal selected from the group consisting of transition metals and alloys thereof; and
an oxide superconductive layer directly on and in surface contact with said interlayer.

22. The body according to claim 21, wherein the substrate is selected from the group consisting of (1) Ti, Zr, Ta, Nb, Fe, Ni, Cr, Co, Mo, and alloys thereof; (2) Ni-Cr, stainless steel, Fe-Ni-Cr, Fe-Cr, Cu-Ni, and Ni-Mo alloys; and (3) $SrTiO_3$, MgO, $ZrO_2$, $Al_2O_3$, BeO, BN, AlN, carbon, $SiO_2$ and polycomponent glass;
wherein the noble metal layer is selected from the group consisting of Ag, Au, Pd, Pt, In, Os, Ru, Rh, and alloys thereof; and
wherein the oxide superconductor consists of an oxide represented by the formula $AB_2Cu_3O_x$, wherein A represents Y, S, Sc, or a rare earth element, B represents an alkaline earth metal, and $X = 7 - \delta$ where $0 \leq \delta < 0.5$.

* * * * *